United States Patent
Park et al.

(10) Patent No.: US 9,659,682 B2
(45) Date of Patent: May 23, 2017

(54) COMPOSITION AND METHOD FOR FORMING CONDUCTIVE PATTERN, AND RESIN STRUCTURE HAVING CONDUCTIVE PATTERN THEREON

(71) Applicant: LG CHEM, LTD., Seoul (KR)

(72) Inventors: Chee-Sung Park, Daejeon (KR); Jae Hyun Kim, Daejeon (KR); Shin Hee Jun, Daejeon (KR); Cheol-Hee Park, Daejeon (KR); Eun Kyu Seong, Daejeon (KR); Sang Yun Jung, Daejeon (KR); Jae Jin Kim, Daejeon (KR); Han Nah Jeong, Daejeon (KR); Su Jeong Lee, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 14/916,100

(22) PCT Filed: Nov. 28, 2014

(86) PCT No.: PCT/KR2014/011581
§ 371 (c)(1),
(2) Date: Mar. 2, 2016

(87) PCT Pub. No.: WO2015/080524
PCT Pub. Date: Jun. 4, 2015

(65) Prior Publication Data
US 2016/0254071 A1    Sep. 1, 2016

(30) Foreign Application Priority Data

Nov. 29, 2013 (KR) .................. 10-2013-0147851
Nov. 27, 2014 (KR) .................. 10-2014-0167731

(51) Int. Cl.
*H05K 1/09* (2006.01)
*H05K 3/10* (2006.01)
(Continued)

(52) U.S. Cl.
CPC ............ *H01B 1/22* (2013.01); *C09D 7/1216* (2013.01); *C09D 11/52* (2013.01); *C09D 169/00* (2013.01);
(Continued)

(58) Field of Classification Search
CPC .......... H05K 3/105; H05K 1/09; H05K 1/092; H05K 1/095; H05K 1/097
See application file for complete search history.

(56) References Cited

U.S. PATENT DOCUMENTS 8,309,640 B2    11/2012    Li et al.
2005/0163987 A1    7/2005    Kliesch et al.
(Continued)

FOREIGN PATENT DOCUMENTS

CN    1518850 A    8/2004
CN    101243205 B    12/2010
(Continued)

*Primary Examiner* — Jeremy C Norris
(74) *Attorney, Agent, or Firm* — Dentons US LLP

(57) ABSTRACT

The present invention relates to a composition for forming a conductive pattern capable of forming a fine conductive pattern on a variety of polymer resin products or resin layers by a significantly simple process, a method for forming a conductive pattern using the same, and a resin structure having a conductive pattern. The composition for forming a conductive pattern includes: a polymer resin; and a non-conductive metal compound including at least one of first and second metals as a predetermined non-conductive metal compound including the first and second metals, wherein a metal core including the first or second metal, or an ion thereof is formed from the non-conductive metal compound by electromagnetic irradiation.

18 Claims, 5 Drawing Sheets

(51) Int. Cl.
*H01B 1/22* (2006.01)
*C09D 11/52* (2014.01)
*H05K 3/18* (2006.01)
*C09D 7/12* (2006.01)
*C09D 169/00* (2006.01)
*C08K 3/22* (2006.01)

(52) U.S. Cl.
CPC .............. *H05K 1/095* (2013.01); *H05K 3/105* (2013.01); *H05K 3/106* (2013.01); *H05K 3/185* (2013.01); *C08K 3/22* (2013.01); *C08K 2003/2248* (2013.01); *C08K 2003/2262* (2013.01); *H05K 2203/0514* (2013.01); *H05K 2203/1157* (2013.01)

(56) References Cited

U.S. PATENT DOCUMENTS

| | | |
|---|---|---|
| 2006/0083939 A1 | 4/2006 | Dunbar et al. |
| 2011/0281135 A1 | 11/2011 | Gong et al. |
| 2012/0276390 A1 | 11/2012 | Ji et al. |
| 2012/0279764 A1 | 11/2012 | Jiang et al. |
| 2013/0168133 A1 | 7/2013 | Schrauwen |

FOREIGN PATENT DOCUMENTS

| | | |
|---|---|---|
| CN | 102471889 A | 5/2012 |
| EP | 0384760 A2 | 8/1990 |
| JP | 2002-158418 A | 5/2002 |
| JP | 2008-205430 A | 9/2008 |
| JP | 2011-017069 A | 1/2011 |
| KR | 10-2004-0021614 A | 3/2004 |
| KR | 10-2005-0077281 A | 8/2005 |
| KR | 10-0716486 B1 | 5/2007 |
| KR | 10-0957737 B1 | 5/2010 |
| KR | 10-2011-0018319 A | 2/2011 |
| KR | 10-2011-0112860 A | 10/2011 |
| KR | 10-2012-0121219 A | 11/2012 |
| KR | 10-2012-0124167 A | 11/2012 |
| KR | 10-2014-0008121 A | 1/2014 |
| KR | 10-2014-0128233 A | 11/2014 |
| KR | 20140128234 A | 11/2014 |
| KR | 20160047931 A | 5/2016 |

COMPOSITION AND METHOD FOR FORMING CONDUCTIVE PATTERN, AND RESIN STRUCTURE HAVING CONDUCTIVE PATTERN THEREON

This application is a National Stage Entry of International Application No. PCT/KR2014/011581, filed on Nov. 28, 2014, and claims the benefit of and priority to Korean Application No. 10-2013-0147851, filed on Nov. 29, 2013, and Korean Application No. 10-2014-0167731, filed on Nov. 27, 2014, all of which are incorporated herein by reference in their entirety for all purposes as if fully set forth herein.

TECHNICAL FIELD

The present invention relates to a composition for forming a conductive pattern capable of forming a fine conductive pattern on a variety of polymer resin products or resin layers by a significantly simple process, a method for forming a conductive pattern using the same, and a resin structure having the conductive pattern.

BACKGROUND

With the recent development of microelectronic technology, a need for structures having a fine conductive pattern formed on the surface of a polymer resin substrate (or product) such as a variety of resin products or resin layers has increased. The conductive patterns on the surface of the polymer resin substrate may be applied to form various objects such as circuits integrated into an electronic device case, antennas, a variety of sensors, MEMS structures, RFID tags, and the like.

As described above, with increasing interest in the technology of forming the conductive pattern on the surface of the polymer resin substrate, several technologies regarding this were suggested. However, a method capable of more effectively using these technologies has not been suggested yet.

For example, according to the previously known technology, a method for forming the conductive pattern by forming a metal layer on the surface of the polymer resin substrate and then applying photolithography, or a method for forming the conductive pattern by printing a conductive paste, or the like, may be considered. However, when the conductive pattern is formed according to this technology, there are disadvantages that a required process or equipment becomes too complicated, or it is difficult to form an excellent fine conductive pattern.

Accordingly, there is a need to develop a technology capable of more effectively forming the fine conductive pattern on the surface of the polymer resin substrate by a simpler process.

DISCLOSURE

Technical Problem

The present invention has been made in an effort to provide a composition for forming a conductive pattern capable of forming a fine conductive pattern on a variety of polymer resin products or resin layers by a significantly simple process, a method for forming a conductive pattern using the same.

In addition, the present invention has been made in an effort to provide a resin structure having a conductive pattern formed from the composition for forming a conductive pattern, or the like.

Technical Solution

An exemplary embodiment of the present invention provides a composition for forming a conductive pattern by electromagnetic irradiation, including: a polymer resin; and a non-conductive metal compound of Chemical Formula 1 including a first metal and a second metal, wherein a metal core including the first or second metal, or an ion thereof is formed from the non-conductive metal compound by electromagnetic irradiation.

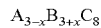     [Chemical Formula 1]

In Chemical Formula 1,

A and B are each independently the first and second metals different from each other, C is oxygen, nitrogen, or sulfur, and x satisfies 0≤x≤0.6.

Examples of the non-conductive metal compound of Chemical Formula 1 may be represented by $A_3B_3C_8$, $A_{2.8}B_{3.2}C_8$, or $A_{2.4}B_{3.6}C_8$, but the present invention is not limited thereto.

In addition, as an example, in the non-conductive metal compound, A may be one or more metals selected from the group consisting of Cu, Ag, Pd, Au, Pt, Ni, and Sn, and B may be one or more metals selected from the group consisting of Mn, Al, Cr, Fe, Mo, and W.

Further, the non-conductive metal compound may have an average particle size of approximately 1 μm or less.

Meanwhile, in the composition for forming a conductive pattern as described above, the polymer resin may include a thermosetting resin or a thermoplastic resin, and specific examples thereof may include one or more selected from the group consisting of an acrylonitrile-butadiene-styrene (ABS) resin, a polyalkylene terephthalate resin such as a polybutylene terephthalate resin, a polyethylene terephthalate resin, or the like, a polycarbonate resin, a polypropylene resin, and a polyphthalamide resin.

Further, in the composition for forming a conductive pattern, the non-conductive metal compound may be included in an amount of approximately 1 to 10 wt %, with respect to the total composition, and the polymer resin may be included in the remaining amount.

In addition, the composition for forming a conductive pattern may further include a coloring additive such as a pigment, a dye, or the like, in addition to the above-mentioned polymer resin and the predetermined non-conductive metal compound. Further, the composition for forming a conductive pattern may further include an additive generally used in the art to which the present invention pertains at the time of processing a polymer resin, for example, one or more additives selected from the group consisting of a functional modifier such as an inorganic filler, a flame retardant, an impact modifier, or the like, a heat stabilizer, a UV stabilizer, a lubricant, and an antioxidant. The composition for forming a conductive pattern according to the present invention may further include coloring additives having various colors as needed, such that various resin products having various colors while having the conductive pattern to thereby satisfy various requirements of a user may be formed.

The coloring additive is a material added as needed in order to impart a color to the composition for forming a conductive pattern as described above, and as a specific example thereof, one or more inorganic pigments selected from the group consisting of carbon black, graphite, graphene, clay, talc, $TiO_2$, $ZrO_2$, $Fe_2O_3$, $BaSO_4$, $CaCO_3$, $SiO_2$, ZnS, ZnO, $ZnCrO_4$, $Cr_2O_3$, $CoO.nAl_2O_3$, and $Co_3(PO_4)_2$; one or more organic pigments selected from the group consisting of copper phthalocyanine and quinacridone; and the like, may be used alone or a mixture of at least one thereof may be used.

In addition the flame retardant may include a phosphorus based flame retardant and an inorganic flame retardant.

Meanwhile, another exemplary embodiment of the present invention provides a method for forming a conductive pattern by direct electromagnetic irradiation on a polymer resin substrate such as a resin product, a resin layer, or the like, using the above-mentioned composition for forming a conductive pattern. The method for forming a conductive pattern may include molding the composition for forming a conductive pattern as described above to a resin product or applying the composition to another product so as to form a resin layer; irradiating an electromagnetic wave to a predetermined region of the resin product or the resin layer so as to generate a metal core including a first or second metal or an ion thereof from non-conductive metal compound; and chemically reducing or plating the region in which the metal core is generated so as to form a conductive metal layer.

In the generating of the metal core in the method for forming a conductive pattern as described above, a laser electromagnetic wave having various wavelengths in a range from approximately 200 nm to approximately 11,000 nm may be irradiated. For example, a laser electromagnetic wave having a wavelength of approximately 248 nm, approximately 308 nm, approximately 355 nm, approximately 532 nm, approximately 585 nm, approximately 755 nm, approximately 1064 nm, approximately 1550 nm, approximately 2940 nm, or approximately 10600 nm may be irradiated.

Further, when the generating of the metal core by electromagnetic irradiation is carried out, the non-conductive metal compound is partially exposed on the surface of the predetermined region of the resin product or the resin layer, and the metal core is generated therefrom, thereby forming a surface (hereinafter, "adhesion-activated surface") which is activated to have higher adhesion. Then, the first or second metal ion included in the metal core is chemically reduced or conductive metal ions are chemically reduced by electroless plating, such that the conductive metal layer may be formed on the adhesion-activated surface. At the time of the electroless plating, the metal cores may function as a kind of seed to form a strong bond with the conductive metal ions in a plating solution when the conductive metal ions are chemically reduced. As a result, the conductive metal layer may be selectively formed in an easier manner.

Further, in the reducing or plating, the predetermined region of the resin product or resin layer on which the metal core is generated may be treated with an acidic or basic solution including a reducing agent, and this solution may include one or more selected from the group consisting of formaldehyde, hypophosphite, dimethylamino borane (DMAB), diethylamino borane (DEAB), and hydrazine as the reducing agent. As another example, in the reducing, the predetermined region of the resin product or resin layer on which the metal core is generated may be treated with an electroless plating solution including a reducing agent and a conductive metal ion, or the like.

Meanwhile, another exemplary embodiment of the present invention provides a resin structure having a conductive pattern obtained by using the composition for forming a conductive pattern and the method for forming a conductive pattern as described above. The resin structure may include a polymer resin substrate; a non-conductive metal compound of Chemical Formula 1, including a first metal and a second metal and dispersed in the polymer resin substrate; an adhesion-activated surface including a metal core including a first or second metal or an ion thereof exposed on a surface of a predetermined region of the polymer resin substrate; and a conductive metal layer formed on the adhesion-activated surface.

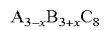 [Chemical Formula 1]

In Chemical Formula 1,

A and B are each independently the first and second metals different from each other, C is oxygen, nitrogen, or sulfur, and x satisfies $0 \leq x \leq 0.6$.

In the resin structure, the predetermined region on which the adhesion-activated surface and the conductive metal layer are formed may correspond to a region of the polymer resin substrate to which an electromagnetic wave is irradiated.

Advantageous Effects

According to the present invention, a composition for forming a conductive pattern capable of forming a fine conductive pattern on a polymer resin substrate such as a variety of polymer resin products or resin layers by a significantly simple process of laser electromagnetic irradiation, a method for forming a conductive pattern using the same, and a resin structure having the conductive pattern may be provided.

Particularly, in the composition for forming a conductive pattern according to the present invention, the non-conductive metal compound is represented by a specific chemical structure of Chemical Formula 1, such that the polymer resin product or resin layer may be more easily implemented by using a material different from an existing material having a spinel structure, represented by $AB_2O_4$, that is, the material represented by Chemical Formula $A_{3-x}B_{3+x}C_8$, and a laser direct structuring (LDS) resin product, or the like, may be effectively manufactured.

Therefore, a conductive pattern for antenna on a variety of resin products such as a mobile phone case, and the like, RFID tags, various sensors, MEMS structures, and the like, may be significantly effectively formed by using the composition for forming a conductive pattern or the method for forming a conductive pattern.

BEST MODE

Figure 1:
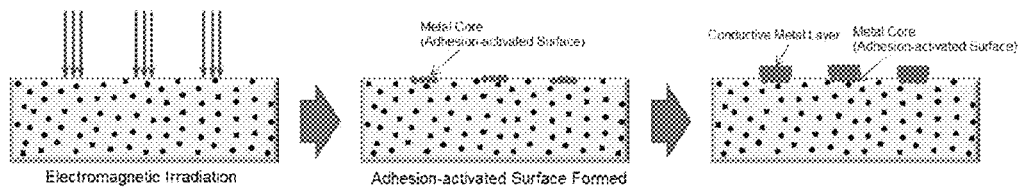
FIG. 1 illustrates a schematic diagram showing each process step of an example of a method for forming a conductive pattern according to another exemplary embodiment of the present invention.

In the present specification, the terms "first", "second", and the like, are used to describe various components, and the terms are used only in order to distinguish one component from other components.

In addition, terms used in the present specification are used in order to describe only specific exemplary embodiments rather than limiting the present invention. Singular forms used in the specification are intended to include plural forms unless the context clearly indicates otherwise. Terms such as "comprise", "include", "have", and the like, used in the present specification will imply the existence of stated features, numbers, steps, configuration elements, or a combination thereof, but do not exclude presence or addition of one or more other features, numbers, steps, configuration elements, or a combination thereof.

Further, in the present specification, each layer or element is referred to as being formed "on" or "over" respective layers or elements, which means that each layer or element may be formed directly on respective layers or elements or another layer or element may be additionally formed between respective layers or on a target material or substrate.

The present invention may be variously modified and have various types, and specific embodiments of the present invention will be descried below in detail with reference to the accompanying drawing. However, the present invention is not limited to the exemplary embodiments described herein, but all of the modifications, equivalents, and substitutions within the spirit and scope of the present invention are also included in the present invention.

Hereinafter, a composition for forming a conductive pattern according to an exemplary embodiment of the present invention, a method for forming a conductive pattern using the same, and a resin structure having a conductive pattern will be described.

According to an exemplary embodiment of the present invention, there is provided a composition for forming a conductive pattern by electromagnetic irradiation, including: a polymer resin; and a non-conductive metal compound represented by Chemical Formula 1 and including a first metal and a second metal, wherein a metal core including the first or second metal, or an ion thereof is formed from the non-conductive metal compound by electromagnetic irradiation.

$$A_{3-x}B_{3+x}C_8 \quad \text{[Chemical Formula 1]}$$

In Chemical Formula 1,

A and B are each independently the first and second metals different from each other, C is oxygen, nitrogen, or sulfur, and x satisfies $0 \leq x \leq 0.6$.

Although described below in more detail, in the case of molding a polymer resin product or resin layer using the composition for forming a conductive pattern and then irradiating an electromagnetic wave such as a laser, or the like, the metal core including the first or second metal or an ion thereof may be formed from the non-conductive metal compound. The metal core may be selectively exposed on a predetermined region to which the electromagnetic wave is irradiated to form an adhesion-activated surface on the surface of the polymer resin substrate. Thereafter, in the case of chemically reducing the metal core, or the like, including the first or second metal or the ion thereof or performing electroless plating with a plating solution including conductive metal ions, and the like, using the metal core as a seed, a conductive metal layer may be formed on the adhesion-activated surface including the metal core.

Through this process, the conductive metal layer, in other words, a fine conductive pattern may be selectively formed only on the predetermined region of the polymer resin substrate, to which the electromagnetic wave is irradiated.

The non-conductive metal compound capable of being represented by a specific chemical formula as described above is non-conductive before irradiating the electromagnetic wave, has excellent compatibility with the polymer resin, and is also chemically stable against a solution used for reduction or plating process, or the like, to thereby maintain non-conductivity.

Therefore, in a region to which the electromagnetic wave is not irradiated, this non-conductive metal compound is chemically stably maintained in a state in which the non-conductive metal compound is uniformly dispersed in the polymer resin substrate, thereby having non-conductivity. On the other hand, in the predetermined region to which the electromagnetic wave such as the laser, or the like, is irradiated, the first or second metal or the ion thereof is easily released from the non-conductive metal compound, such that the fine conductive pattern may be formed by the above-mentioned principle. As described above, the first or second metal or the ion thereof is more easily released from the non-conductive metal compound by electromagnetic irradiation and accordingly, the adhesion-activated surface having the metal core and the conductive metal layer may be easily formed. The reason may be that the non-conductive metal compound represented by Chemical Formula, $A_{3-x}B_{3+x}C_8$ is chemically stable in a general environment, but when the non-conductive metal compound is exposed to an electromagnetic wave having a specific wavelength, the first metal represented by A may be easily separated from the material. As a specific example, $Cu_3Mn_3O_8$ is chemically stable in a general environment, but when $Cu_3Mn_3O_8$ is exposed to an electromagnetic wave, Cu may be easily separated, such that the adhesion-activated surface and the conductive metal layer may be easily formed.

Therefore, in the case of using the composition for forming a conductive pattern according to an exemplary embodiment of the present invention, a more excellent fine conductive pattern may be easily formed due to the above-mentioned distinctive property of the non-conductive metal compound as compared to the case of using a compound ($CuCr_2O_4$) having a spinel structure represented by Chemical Formula $AB_2O_4$. Further, due to the property as described above, when using the composition for forming a conductive pattern according to an exemplary embodiment, an excellent and fine conductive metal layer may be more easily formed even in the case of decreasing an amount of the used non-conductive metal compound, more specifically, an amount or a content of the used first or second metal, as compared to cases using other compositions including the non-conductive metal compounds having a three-dimensional structure such as the spinel structure, and the like. In addition, even though an amount of laser irradiation is relatively small, a conductive pattern having excellent adhesion may be formed. Therefore, in the case of using the composition for forming a conductive pattern according to an exemplary embodiment of the present invention, a laser direct structuring (LDS) resin product, or the like, may be effectively manufactured.

As described above, in the case of using the composition for forming a conductive pattern according to an exemplary embodiment of the present invention, the fine and excellent conductive pattern may be easily formed on the polymer resin substrate by a significantly simple process of irradiating the electromagnetic wave such as the laser, or the like and reducing the corresponding region. Therefore, a conductive pattern for antenna on a variety of resin products, RFID tags, various sensors, MEMS structures, and the like, may be significantly effectively formed on a variety of polymer resin products or resin layers by using the composition for forming a conductive pattern as described above.

Meanwhile, in the composition for forming a conductive pattern according to an exemplary embodiment, the metal included in the non-conductive metal compound capable of being represented by Chemical Formula 1 or the ion thereof may be more easily released therefrom. Therefore, an amount of the used non-conductive compound may be further decreased and selective formation of the metal core and the conductive pattern may be more easily performed by using the composition including the non-conductive metal compound as described above.

In addition, as an example, in Chemical Formula 1, A may be one or more metals selected from the group consisting of Cu, Ag, Pd, Au, Pt, Ni, and Sn, and B may be one or more metals selected from the group consisting of Mn, Al, Cr, Fe, Mo, and W. Therefore, resin products or resin layers having various colors from colorless or ocher to black may be more easily implemented by using the composition according to an exemplary embodiment.

In this case, as a specific example, the first metal may be one or more metals selected from the group consisting of Cu, Ag, Pd, Au, Pt, Ni, and Sn to thereby serve as a metal source released from the non-conductive metal compound by electromagnetic irradiation, and the remaining second metal may be one or more metals selected from the group consisting of Mn, Al, Cr, Fe, Mo, and W.

Therefore, the first or second metal may be more easily released from the non-conductive metal compound by electromagnetic irradiation, and selective formation of the metal core and the conductive pattern may be easily performed by the above-mentioned principle.

The non-conductive metal compound may have an average particle size of approximately 1 μm or less, preferably approximately 100 nm to approximately 1 μm.

Meanwhile, in the composition for forming a conductive pattern according to the above-mentioned exemplary embodiment, any thermosetting resin or thermoplastic resin capable of forming various polymer resin products or resin layers may be used without specific limitation, as the polymer resin. In particular, the non-conductive metal compound having the above-described specific three-dimensional structure may exhibit excellent compatibility with various polymer resins and uniform dispersibility, and the composition according to an exemplary embodiment may include various polymer resins to thereby be molded as various resin products or resin layers. Specific examples of the polymer resin may include an acrylonitrile-butadiene-styrene (ABS) resin, a polyalkylene terephthalate resin such as a polybutylene terephthalate resin, a polyethylene terephthalate resin, or the like, a polycarbonate resin, a polypropylene resin, a polyphthalamide resin, and the like, and may include various polymer resins in addition thereto.

Further, in the composition for forming a conductive pattern, the non-conductive metal compound may be included in an amount of approximately 1 to 10 wt %, or approximately 3 to 7 wt % with respect to the total composition, and the polymer resin may be included in the remaining amount. According to the above-described content range, basic physical properties such as mechanical physical properties, and the like, of the polymer resin products or the resin layers formed from the composition may be excellently maintained, and the conductive pattern may be preferably formed on a predetermined region by the electromagnetic irradiation. As previously described, the composition according to an exemplary embodiment may include the non-conductive metal compound having the specific three-dimensional structure, such that even though the composition includes only the non-conductive metal compound at a lower content, the metal core and the conductive pattern may be more effectively formed by the electromagnetic irradiation. Therefore, excellent basic physical properties of the resin product or the resin layer may be more easily maintained by decreasing the content of the non-conductive metal compound.

In addition, the composition for forming a conductive pattern may further include a coloring additive such as a pigment, a dye, or the like, in addition to the above-mentioned polymer resin and predetermined non-conductive metal compound. Further, the composition for forming a conductive pattern may further include an additive generally used at the time of processing a polymer resin, for example, one or more additives selected from the group consisting of a functional modifier such as an inorganic filler, a flame retardant, an impact modifier, or the like, a heat stabilizer, a UV stabilizer, a lubricant, and an antioxidant.

The coloring additive is a material added as needed in order to impart a color to the composition for forming a conductive pattern as described above, and as a specific example thereof, one or more inorganic pigments selected from the group consisting of carbon black, graphite, graphene, clay, talc, $TiO_2$, $ZrO_2$, $Fe_2O_3$, $BaSO_4$, $CaCO_3$, $SiO_2$, ZnS, ZnO, $ZnCrO_4$, $Cr_2O_3$, $CoO.nAl_2O_3$, and $Co_3(PO_4)_2$; one or more organic pigments selected from the group consisting of copper phthalocyanine and quinacridone; and the like, may be used alone or a mixture of at least one thereof may be used.

In addition, various additives known to be applicable to compositions for forming a resin product may be all used without specific limitation.

According to an exemplary embodiment of the present invention, the flame retardant may include a phosphorus based flame retardant and an inorganic flame retardant. Specific examples of the phosphorus based flame retardant may include phosphate based flame retardants including triphenyl phosphate (TPP), trixylenyl phosphate (TXP), tricresyl phosphate (TCP), triisophenyl phosphate (REOFOS), and the like; halogen-phosphate based flame retardants including tris-chloroethyl phosphate (TCEP), trischloropropyl phosphate (TCPP), and the like; aromatic polyphosphate based flame retardants; polyphosphate based flame retardant; and red phosphorus based flame retardants, and specific examples of the inorganic flame retardant may include aluminum hydroxide, magnesium hydroxide, zinc borate, molybdenum oxide ($MoO_3$), a molybdenum peroxide salt ($Mo_2O_7^{2-}$), a calcium-zinc-molybdenum salt, antimony trioxide ($Sb_2O_3$), antimony pentaoxide ($Sb_2O_5$), and the like, but the present invention is not limited thereto. That is, any flame retardant may be used without specific limitation as long as it may be used at the time of processing a polymer resin.

Meanwhile, according to another exemplary embodiment of the present invention, there is provided a method for forming a conductive pattern by direct electromagnetic irradiation on a polymer resin substrate such as a resin product, a resin layer, or the like, using the above-mentioned composition for forming a conductive pattern. The method for forming a conductive pattern may include molding the composition for forming a conductive pattern as described above to a resin product or applying the composition to another product so as to form a resin layer; irradiating an electromagnetic wave to a predetermined region of the resin product or the resin layer so as to generate a metal core including a first or second metal or an ion thereof from non-conductive metal compound; and chemically reducing or plating the region in which the metal core is generated so as to form a conductive metal layer.

Hereinafter, each step of the method for forming a conductive pattern according to another exemplary embodiment will be described with reference to the accompanying drawings. For reference, FIG. 1 illustrates a schematic diagram showing each process step of an example of the method for forming a conductive pattern, and FIG. 2 is electron microscopic images showing a form in which an adhesion-activated surface including a metal core is formed on a surface of a polymer resin substrate by electromagnetic irradiation in an example of the method for forming a conductive pattern.

In the method for forming a conductive pattern, first, the above-described composition for forming a conductive pattern may be molded to the resin product or applied to another product so as to form the resin layer. In the molding of the resin product or the forming of the resin layer, general methods for molding products using polymer resin compositions or general methods for forming resin layers may be applied without specific limitation. For example, in the molding of the resin product using the composition, the composition for forming a conductive pattern is extruded and cooled to form in a pellet or particle form, which are subjected to injection molding to have a desired shape, thereby manufacturing various polymer resin products.

The polymer resin product or the resin layer formed as described above may have a shape in which the above-mentioned non-conductive metal compound having the specific three-dimensional structure is uniformly dispersed in the resin substrate formed from the polymer resin. In particular, since the non-conductive metal compound has excellent compatibility with various polymer resins, sufficient solubility, and chemical stability, it may be uniformly dispersed throughout the resin substrate to thereby be maintained in a non-conductive state.

Figure 2:
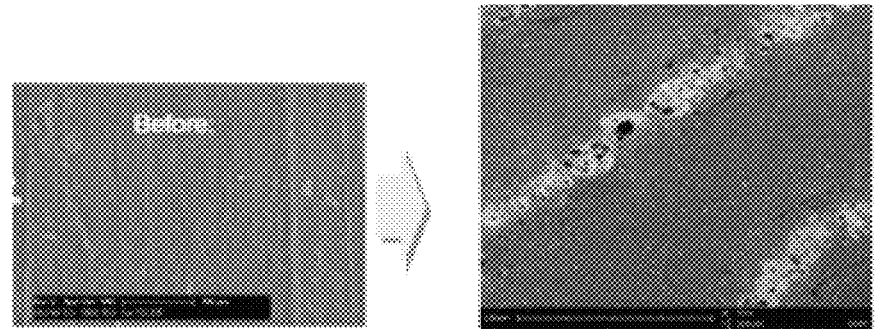
FIG. 2 is electron microscopic images showing a form in which an adhesion-activated surface including a metal core is formed on a surface of a polymer resin substrate by electromagnetic irradiation in the example of the method for forming a conductive pattern according to another exemplary embodiment of the present invention.

After forming the polymer resin product or the resin layer, as shown in FIGS. 1 and 2, an electromagnetic wave such as laser, or the like, may be irradiated to the predetermined region of the resin product or the resin layer, on which the conductive pattern is intended to be formed. When the electromagnetic wave is irradiated, the first or second metal or the ion thereof may be released from the non-conductive metal compound, and the metal core including the first or the second metal or the ion thereof may be generated.

More specifically, when the generating of the metal core by electromagnetic irradiation is carried out, the non-conductive metal compound is partially exposed on the surface of the predetermined region of the resin product or the resin layer to thereby generate the metal core therefrom, such that the adhesion-activated surface activated so as to have higher adhesion may be formed. As the adhesion-activated surface is selectively formed only on the specific region to which the electromagnetic wave is irradiated, in the case in which a reducing or plating process to be described below is performed, the conductive metal ions are chemically reduced by chemical reduction of the first or second metal ions included in the metal core and the adhesion-activated surface, or by electroless plating thereof, such that the conductive metal layer may be selectively formed on the predetermined region of the polymer resin substrate. In more detail, at the time of the electroless plating, the metal cores may function as a kind of seed to form a strong bond with the conductive metal ions in a plating solution when the conductive metal ions are chemically reduced. As a result, the conductive metal layer may be selectively formed in an easier manner.

Meanwhile, in the generating of the metal core as described above, among the electromagnetic waves, a laser electromagnetic wave, for example, a laser electromagnetic wave having various wavelengths in a ranged of approximately 200 nm to 11,000 nm, may be irradiated. Specifically, a laser electromagnetic wave having a wavelength of approximately 248 nm, approximately 308 nm, approximately 355 nm, approximately 532 nm, approximately 585 nm, approximately 755 nm, approximately 1064 nm, approximately 1550 nm, approximately 2940 nm, or approximately 10600 nm may be irradiated. The metal core may be more effectively generated from the non-conductive metal compound by laser irradiation as described above, and the adhesion-activated surface including the metal core may be selectively generated and exposed on the predetermined region.

Figure 3:
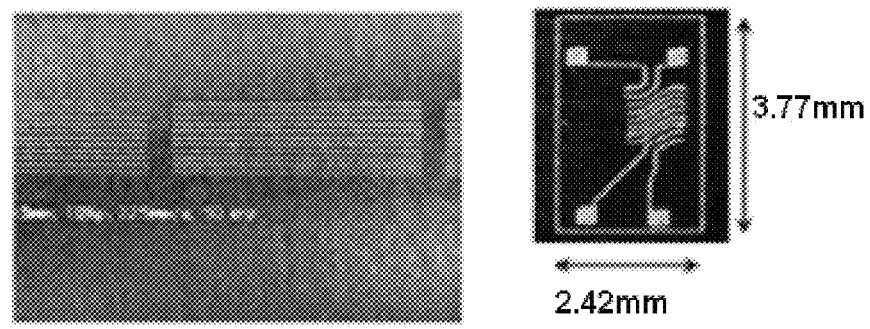
FIG. 3 is photographs showing an example of a resin structure in which a fine conductive pattern is formed on a resin product or resin layer.

Meanwhile, after the generating of the metal core as described above is performed, the forming of the conductive metal layer by chemically reducing or plating the region in which the metal core and the adhesion-activated surface are formed may be carried out, as shown in FIG. 1. As a result of the reducing or the plating step, the conductive metal layer may be selectively formed on the predetermined region in which the metal core and the adhesion-activated surface are exposed, and on the other region, the chemically stable non-conductive metal compound may maintain non-conductivity as it is. Therefore, the fine conductive pattern may be selectively formed only on the predetermined region of the polymer resin substrate as shown in FIG. 3.

In the reducing or plating step, the predetermined region of the resin product or resin layer on which the metal core is generated may be treated with an acidic or basic solution including a reducing agent, and this solution may include one or more selected from the group consisting of formaldehyde, hypophosphite, dimethylamino borane (DMAB), diethylamino borane (DEAB), and hydrazine as the reducing agent. As another example, in the reducing step, the predetermined region of the resin product or resin layer on which the metal core is generated may be treated with an electroless plating solution including a reducing agent and a conductive metal ion, or the like.

As the reducing or the plating step is carried out, the first or the second metal ions included in the metal core are reduced, or the conductive metal ions included in the electroless plating solution are chemically reduced in the region where the metal core is formed as a seed, and therefore, an excellent conductive pattern may be selectively formed on the predetermined region. Here, the metal core and the adhesion-activated surface may form a strong bond with the chemically reduced conductive metal ions, and as a result, the conductive pattern may be more easily formed selectively on the predetermined region.

Meanwhile, according to still another exemplary embodiment of the present invention, there is provided a resin structure having a conductive pattern obtained by using the composition for forming a conductive pattern and the method for forming a conductive pattern as described above. The resin structure may include a polymer resin substrate; a non-conductive metal compound of Chemical Formula 1, including a first metal and a second metal and dispersed in the polymer resin substrate; an adhesion-activated surface including a metal core including a first or second metal or an ion thereof exposed on a surface of a predetermined region of the polymer resin substrate; and a conductive metal layer formed on the adhesion-activated surface.

In the resin structure as described above, the predetermined region on which the adhesion-activated surface and the conductive metal layer are formed may correspond to a region of the polymer resin substrate to which an electromagnetic wave is irradiated. In addition, the first or second metal or the ion thereof included in the metal core of the adhesion-activated surface may be derived from the non-conductive metal compound. Meanwhile, the conductive metal layer may be derived from the first or second metal or from the conductive metal ions included in an electroless plating solution.

In addition, the resin structure may further include residues which are dispersed in the polymer resin substrate and derived from the non-conductive metal compound. These residues may have a structure in which the first or second metal is at least partially released from the non-conductive metal compound, and thus, vacancy is formed in at least one portion of the compound.

The above-mentioned resin structure may become various resin products or resin layers such as a mobile phone case having the conductive pattern for antenna, or the like, or may become various resin products or resin layers having the conductive pattern such as RFID tags, various sensors, MEMS structures, circuit boards, or the like.

As described above, according to exemplary embodiments of the present invention, various resin products having various fine conductive patterns may be preferably and easily formed by the significantly simple method of irradiating the electromagnetic wave such as the laser, or the like, and performing the reduction or plating. An example of forming a fine conductive pattern on a resin product or resin layer as described above is shown in FIG. 3. As shown in FIG. 3, since the fine conductive pattern may be formed on various resin products or resin layers by the significantly simple process as described above, the present invention may significantly contribute to implementing various shaped resin products including a novel resin product that is not suggested in the past. Particularly, the composition for forming a conductive pattern according to the present invention may further include coloring additives having various colors as needed, such that various resin products having various colors while having the conductive pattern to thereby satisfy various requirements of a user may be formed.

Hereinafter, actions and effects of the present invention will be described in detail with reference to specific Examples of the present invention. However, the Examples are only for illustrative purposes and are not intended to limit the scope of the present invention.

Formation of Conductive Pattern by Direct Laser Irradiation

Example 1

Copper oxide (CuO) and manganese dioxide ($MnO_2$) were mixed with each other as raw materials, and heat-treated at 1000 to 1100° C. for about 2 hours, thereby synthesizing $Cu_3Mn_3O_8$.

A synthetic process may be represented by the following Chemical Reaction Formula.

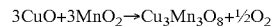

Figure 4:
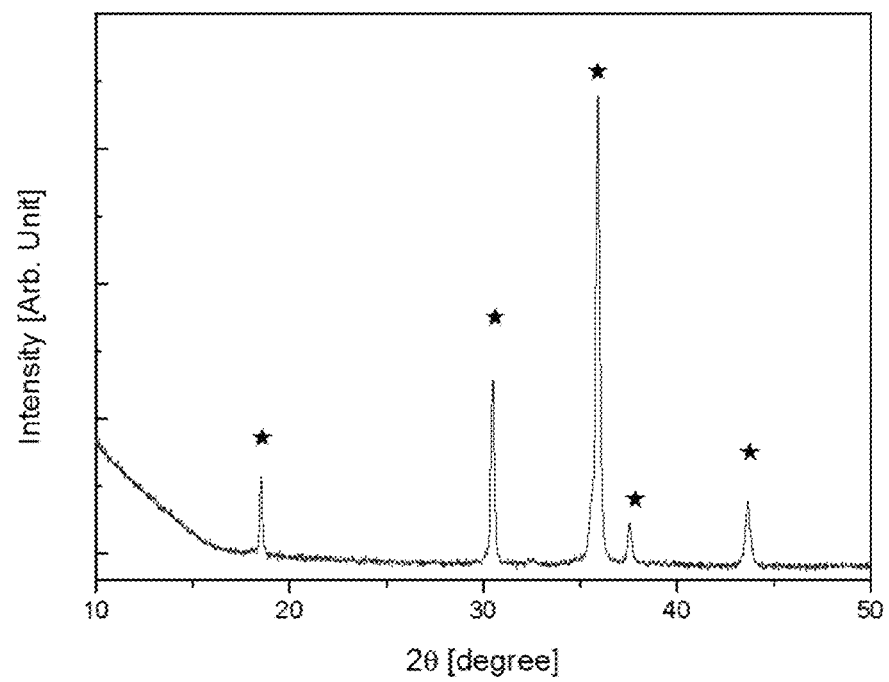
FIG. 4 is a graph showing a result of X-ray diffraction (XRD) analysis of an example of a non-conductive metal compound obtained in Example 1 of the present invention.

A XRD pattern indicating crystalline properties of $Cu_3Mn_3O_8$ was shown in FIG. 4. Referring to FIG. 4, it may be confirmed that strong peaks were formed when a 2θ (theta) value was about 18.5°, about 30.5°, about 36°, about 37.5°, and about 43.5°. These peaks were caused by (111), (220), (311), (222), and (400), respectively, and it may be confirmed that $Cu_3Mn_3O_8$ having a cubic structure was synthesized.

Figure 5:
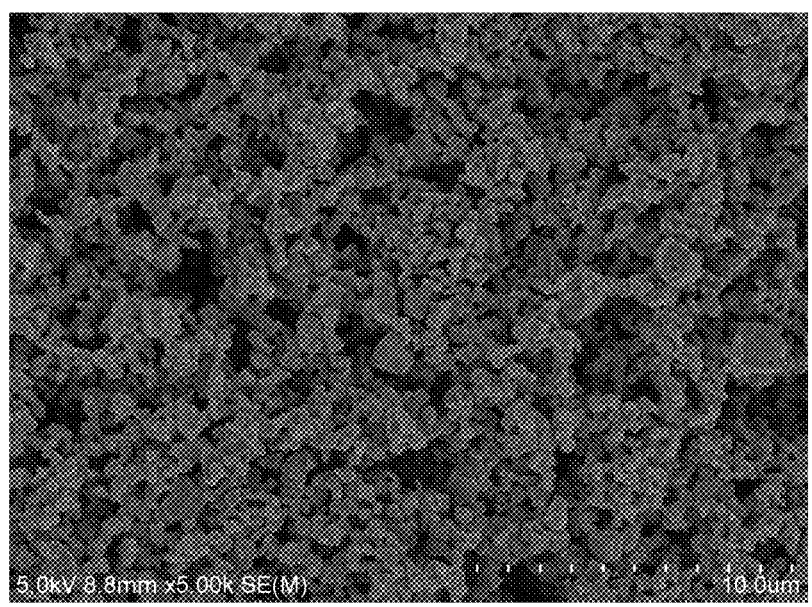
FIG. 5 is an electron microscopic image showing non-conductive metal compound powder obtained in Example 1 of the present invention.

A non-conductive metal compound synthesized as described above was ground to thereby be prepared in a form of powder having an average particle size of about 100 nm to 1 μm, and then used as an additive. FIG. 5 is an electron microscopic image showing a non-conductive metal compound powder additive prepared as described above. Referring to FIG. 5, it may be confirmed that the non-conductive metal compound was formed in a form of amorphous powder having an average particle size of about 100 nm to 1 μm.

A composition for a conductive pattern by electromagnetic irradiation was prepared by using a polycarbonate resin as a base resin and $Cu_3Mn_3O_8$ corresponding to the non-conductive metal compound together with additives for processes and stabilization.

As the additives, unless described otherwise in the following Examples, a heat stabilizer (product name: IR1076, PEP36), a UV stabilizer (product name: UV329), a lubricant (product name: EP184), and an impact modifier (product name: S2001) were used.

A composition was obtained by mixing 92 wt % of the polycarbonate resin, 3 wt % of the non-conductive metal compound, and 5 wt % of other additives (the heat stabilizer, the UV stabilizer, the lubricant, and the impact modifier) with each other based on a total weight (100 wt %) of the composition, and the obtained composition was extruded by an extruder at a temperature of 260 to 280° C. The extruded pellet-type resin structure was subjected to injection molding at approximately 260 to 270° C. in a form of a substrate having a diameter of 100 mm and a thickness of 2 mm.

Figure 6:
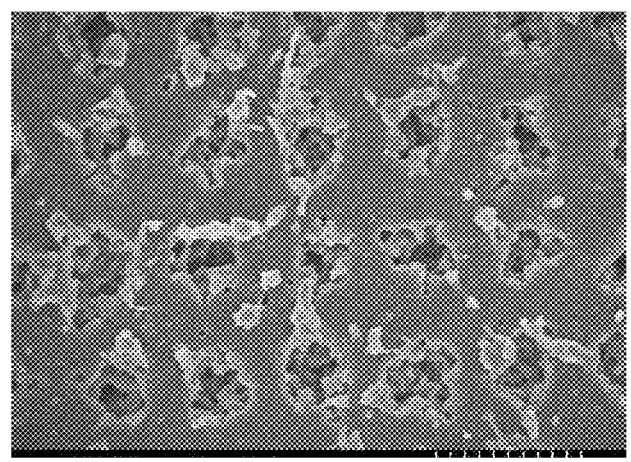
FIG. 6 is an electron microscopic image of a surface of a resin structure formed by obtaining a resin structure including the non-conductive metal compound powder in Example 1 of the present invention and then irradiating laser thereon.

Laser having a wavelength of 1064 nm was irradiated to the resin structure under the conditions of 40 kHz and 3 to 10 W using a Nd-YAG laser irradiation device, thereby activating a surface thereof. FIG. 6, which is an example of activation of a surface of the resin by laser irradiation, is an electron microscopic image showing a form in which an adhesion-activated surface including a metal core is formed on the surface of the resin substrate.

An electroless plating process was performed on the resin structure on which the adhesion-activated surface was formed as follows. A plating solution (hereinafter, referred to as a PA solution) was prepared by dissolving 3 g of copper sulfate, 14 g of Rochelle salt, and 4 g of sodium hydroxide in 100 ml of deionized water. 1.6 ml of formaldehyde was added to 40 ml of the prepared PA solution as a reducing agent. The resin structure of which the surface was activated by laser was immersed in the plating solution for 4 to 5 hours, and then washed with distilled water, thereby preparing a resin structure having a conductive pattern.

Figure 7:
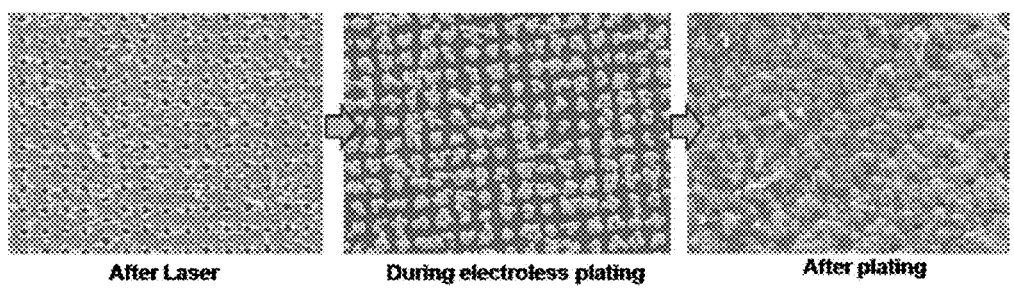
FIG. 7 is electron microscopic images of a surface state (copper growth process in the surface) after laser irradiation, during an electroless plating process, and after a final conductive pattern is formed in Example 1 of the present invention.

FIG. 7 is electron microscopic images for the resin structure after performing the electroless plating. Referring to FIG. 7, it may be confirmed that a copper layer was plated on the surface of the resin structure to which laser was irradiated, that is, the adhesion-activated surface before plating, such that the conductive pattern was formed.

Example 2

A resin structure having a conductive pattern was prepared in the same manner as in Example 1 except for obtaining the composition by mixing 90 wt % of the polycarbonate resin, 5 wt % of the non-conductive metal compound, and 5 wt % of other additives (the heat stabilizer, the UV stabilizer, the lubricant, and the impact modifier) with each other based on a total weight (100 wt %) of the composition.

Example 3

A resin structure having a conductive pattern was prepared in the same manner as in Example 1 except for obtaining the composition by mixing 89.5 wt % of the polycarbonate resin, 5 wt % of the non-conductive metal compound, 0.5 wt % of a coloring additive (carbon black), and 5 wt % of other additives (the heat stabilizer, the UV stabilizer, the lubricant, and the impact modifier) with each other based on a total weight (100 wt %) of the composition.

Example 4

A resin structure having a conductive pattern was prepared in the same manner as in Example 1 except for obtaining the composition by mixing 85 wt % of the polycarbonate resin, 5 wt % of the non-conductive metal compound, 5 wt % of a coloring additive ($TiO_2$), and 5 wt % of other additives (the heat stabilizer, the UV stabilizer, the lubricant, and the impact modifier) with each other based on a total weight (100 wt %) of the composition.

A composition ratio of each of the compositions used in Examples 1 to 4 was shown in the following Table 1.

TABLE 1

|  | Polycarbonate resin (wt %) | Non-conductive metal compound (wt %) | Coloring additive (wt %) | Other additives (wt %) |
|---|---|---|---|---|
| Example 1 | 92 | 3 | — | 5 |
| Example 2 | 90 | 5 | — | 5 |
| Example 3 | 89.5 | 5 | 0.5 (Carbon Black) | 5 |
| Example 4 | 85 | 5 | 5 ($TiO_2$) | 5 |

Experimental Example: Evaluation on Adhesion of Conductive Pattern

Adhesion of the conductive pattern with respect to each of the resin structures having the conductive patterns obtained in Examples 1 to 4 was evaluated according to the standard ISO 2409. In addition, a minimum laser irradiation intensity required in order to achieve ISO 2409 Class 0 in the case of using the compositions used in Examples 1 to 4 was measured.

The results were shown in the following Table 2.

TABLE 2

|  | Adhesion Evaluation (ISO 2409*) | Minimum laser irradiation intensity (W, at 1064 nm) |
|---|---|---|
| Example 1 | Class 0 | 8.5 |
| Example 2 | Class 0 | 7.0 |
| Example 3 | Class 0 | 5.7 |
| Example 4 | Class 0 | 5.7 |

*In the adhesion evaluation according to the standard ISO 2409, Class 0 means that a delamination area is 0% of an area of a target to be evaluated, and Class 1 means that delamination area is more than 0% to 5% or less of the area of the target to be evaluated.

Referring to Table 2, in all of the Examples 1 to 4 of the present invention, the adhesion was evaluated as Class 0 under the above-mentioned conductions. Therefore, it may be confirmed that adhesion of the conductive pattern was significantly excellent.

Figure 8:
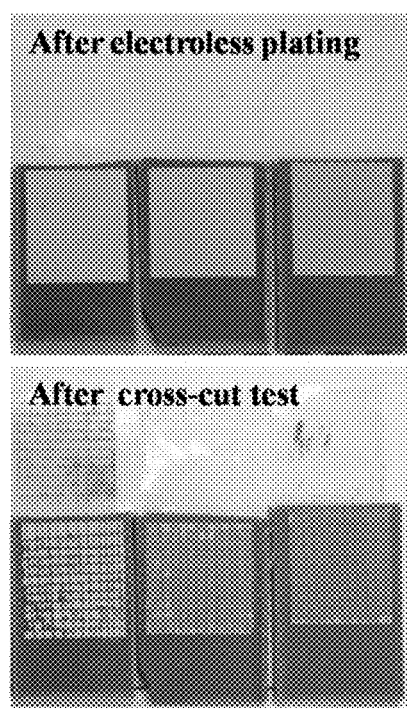
FIG. 8 illustrates a form in which the conductive pattern is formed immediately after plating and a form after adhesion performance test (cross-cut test according to the standard ISO 2409) in Example 1 of the present invention.

FIG. 8 is a photograph illustrating evaluation results of adhesion (cross-cut test according to the standard ISO 2409) of the conductive pattern with respect to the resin structure obtained in Example 1 of the present invention. Referring to FIG. 8, it may be confirmed that in the resin structure according to an exemplary embodiment of the present invention, the conductive pattern had significantly excellent adhesion on the resin substrate.

Further, referring to Table 2, it may be confirmed that in all of the Examples 1 to 4 of the present invention, even though a relative small amount of laser was irradiated, the conductive pattern having excellent adhesion may be easily formed. In addition, it may be confirmed in Examples 3 and 4 that in the case of mixing the non-conductive metal compound and the coloring additive to implement the resin structure, the conductive pattern having significantly excellent adhesion may be implemented even at a lower laser intensity.

The invention claimed is:

1. A composition for forming a conductive pattern by electromagnetic irradiation, the composition comprising:
    a polymer resin; and
    a non-conductive metal compound of Chemical Formula 1 including a first metal and a second metal,
    wherein a metal core including the first metal, the second metal, or an ion thereof is formed from the non-conductive metal compound by electromagnetic irradiation:

$$A_{3-x}B_{3+x}C_8 \qquad \text{[Chemical Formula 1]}$$

in Chemical Formula 1,
    A and B are each independently the first and second metals different from each other,
    C is oxygen, nitrogen, or sulfur, and
    x satisfies $0 \leq x \leq 0.6$.

2. The composition of claim 1, wherein A is one or more metals selected from the group consisting of Cu, Ag, Pd, Au, Pt, Ni, and Sn, and B is one or more metals selected from the group consisting of Mn, Al, Cr, Fe, Mo, and W.

3. The composition of claim 1, wherein the non-conductive metal compound has an average particle size of 1 μm or less.

4. The composition of claim 1, wherein the polymer resin includes a thermosetting resin or a thermoplastic resin.

5. The composition of claim 4, wherein the polymer resin includes one or more selected from the group consisting of an ABS resin, a polyalkylene terephthalate resin, a polycarbonate resin, a polypropylene resin, and a polyphthalamide resin.

6. The composition of claim 1, wherein the non-conductive metal compound is included in an amount of 1 to 10 wt %, with respect to the total composition.

7. The composition of claim 1, further comprising a coloring additive; and one or more additives selected from the group consisting of an inorganic filler, a flame retardant, an impact modifier, a heat stabilizer, a UV stabilizer, a lubricant, and an antioxidant.

8. The composition of claim 7, wherein the coloring additive includes one or more selected from the group consisting of carbon black, graphite, graphene, clay, talc, $TiO_2$, $ZrO_2$, $Fe_2O_3$, $BaSO_4$, $CaCO_3$, $SiO_2$, ZnS, ZnO, $ZnCrO_4$, $Cr_2O_3$, $CoO \cdot nAl_2O_3$, $Co_3(PO_4)_2$, copper phthalocyanine, and quinacridone.

9. The composition of claim 7, wherein the flame retardant includes a phosphorus based flame retardant and an inorganic flame retardant.

10. A method for forming a conductive pattern by direct electromagnetic irradiation, the method comprising:
    molding the composition of claim 1 to a resin product or applying the composition to another product so as to form a resin layer;
    irradiating an electromagnetic wave to a predetermined region of the resin product or the resin layer so as to generate a metal core including a first or second metal or an ion thereof from a non-conductive metal compound; and
    chemically reducing or plating the region in which the metal core is generated so as to form a conductive metal layer.

11. The method of claim 10, wherein in the generating of the metal core, a laser electromagnetic wave is irradiated.

12. The method of claim 11, wherein the laser electromagnetic wave has a wavelength of 200 nm to 11000 nm.

13. The method of claim 10, wherein in the generating of the metal core, the non-conductive metal compound is partially exposed on a surface of the predetermined region of the resin product or the resin layer to thereby generate the metal core therefrom, and an adhesion-activated surface activated so as to have higher adhesion is formed.

14. The method of claim 13, wherein the conductive metal layer is formed on the adhesion-activated surface by chemical reduction of the first or second metal ion included in the metal core or electroless plating thereof.

15. The method of claim 10, wherein in the reducing or plating, the region on which the metal core is generated is treated with an acidic or basic solution including a reducing agent.

16. The method of claim 15, wherein the reducing agent is one or more selected from the group consisting of formaldehyde, hypophosphite, dimethylamino borane (DMAB), diethylamino borane (DEAB), and hydrazine.

17. A resin structure having a conductive pattern, the resin structure comprising:
    a polymer resin substrate;
    a non-conductive metal compound of Chemical Formula 1 including a first metal and a second metal and dispersed in the polymer resin substrate;
    an adhesion-activated surface including a metal core including the first or second metal or an ion thereof exposed on a surface of a predetermined region of the polymer resin substrate; and
    a conductive metal layer formed on the adhesion-activated surface:

  [Chemical Formula 1]

in Chemical Formula 1,
A and B are each independently the first and second metals different from each other,
C is oxygen, nitrogen, or sulfur, and
x satisfies $0 \leq x \leq 0.6$.

18. The resin structure of claim 17, wherein a predetermined region on which the adhesion-activated surface and the conductive metal layer are formed corresponds to a region of the polymer resin substrate to which an electromagnetic wave is irradiated.

* * * * *